United States Patent [19]

Lippert

[11] Patent Number: 4,628,405
[45] Date of Patent: Dec. 9, 1986

[54] INTEGRATED CIRCUIT PRECISION CAPACITOR

[75] Inventor: John A. Lippert, Sunnyvale, Calif.
[73] Assignee: National Semiconductor Corporation, Santa Clara, Calif.
[21] Appl. No.: 766,474
[22] Filed: Aug. 19, 1985
[51] Int. Cl.[4] .......................... H01G 4/10; H01G 7/00
[52] U.S. Cl. ..................................... 361/321; 29/25.42
[58] Field of Search ............... 361/320, 321, 303, 304, 361/305; 29/25.42; 427/79, 81

[56] References Cited

U.S. PATENT DOCUMENTS

| | | | |
|---|---|---|---|
| 3,201,667 | 8/1965 | Varga | 361/321 X |
| 3,273,033 | 9/1966 | Rossmeisl | 29/25.42 X |
| 3,387,952 | 6/1968 | La Chapelle | 427/79 X |
| 3,470,018 | 9/1969 | Smith et al. | 361/321 X |
| 3,615,981 | 10/1971 | Pratt et al. | 29/25.42 X |
| 3,819,990 | 6/1974 | Hayashi et al. | 29/25.42 X |
| 4,335,371 | 6/1982 | Connolly et al. | 340/347 M X |

Primary Examiner—Donald A. Griffin
Attorney, Agent, or Firm—Gail W. Woodward; Paul J. Winters

[57] ABSTRACT

A refractory metal or a refractory metal silicide is applied to a monolithic IC where capacitors are desired and then covered with an amorphous silicon coating. The coating protects the capacitor metal or silicide during IC fabrication. The capacitor dielectric is created by oxidizing the protective coating, leaving the interface continuous and free of native oxides and trapping states. The result is a capacitor that has a very low voltage coefficient of capacitance.

6 Claims, 5 Drawing Figures

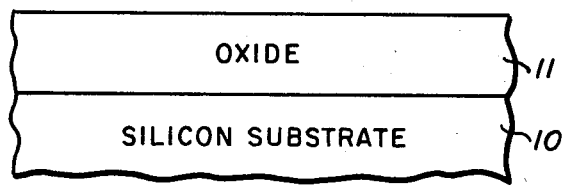
Fig_1
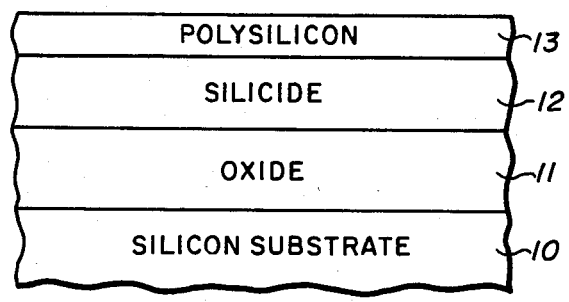
Fig_2
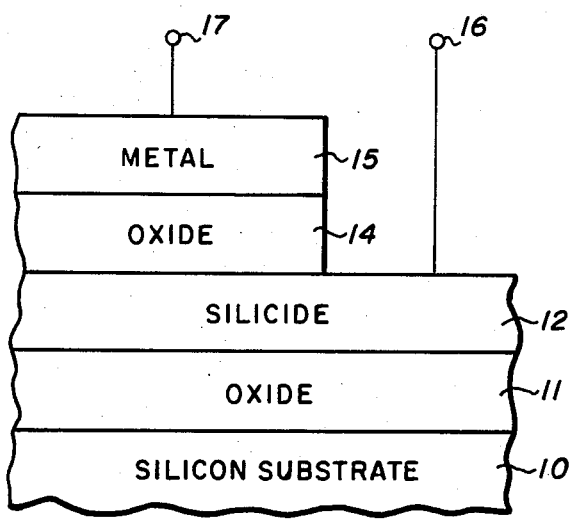
Fig_3

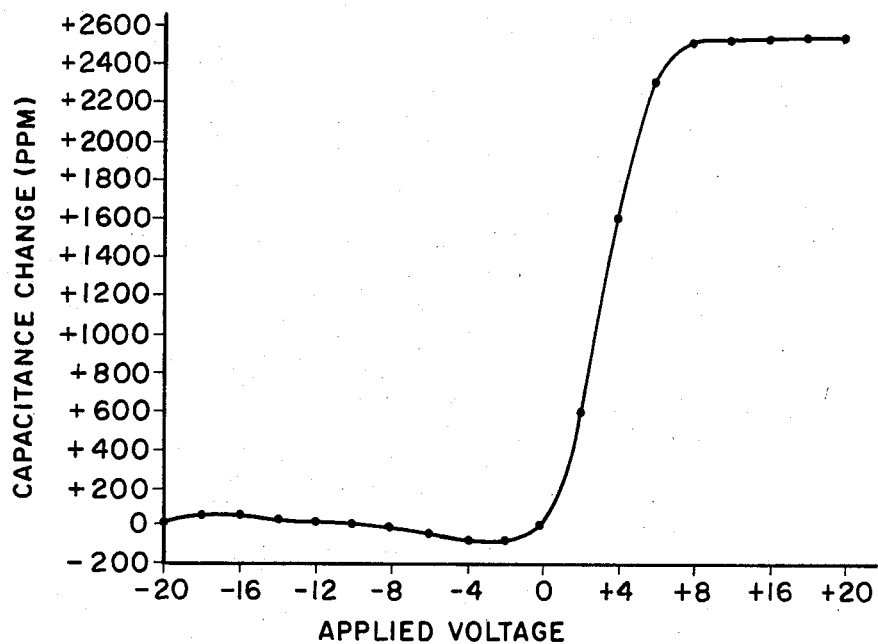
Fig_4 (PRIOR ART)
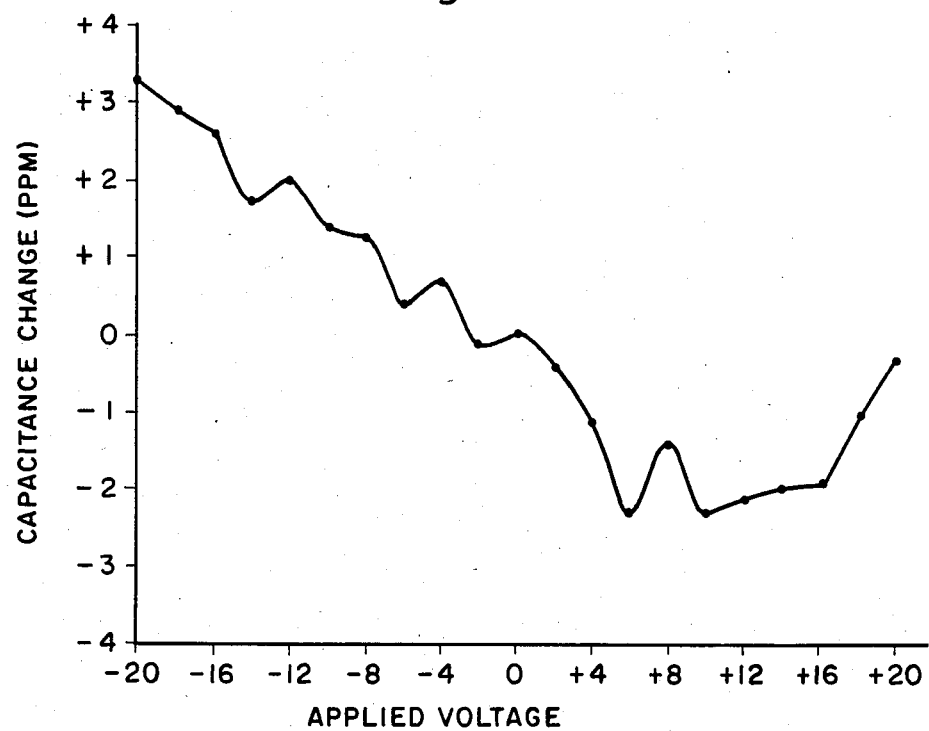
Fig_5

INTEGRATED CIRCUIT PRECISION CAPACITOR

BACKGROUND OF THE INVENTION

Many integrated circuit (IC) designs require capacitors. Where feasible they are included as on-chip devices. Commonly used structures employ metal plates separated by a deposited dielectric. Polycrystalline silicon (polysilicon) plates have proven useful with deposited or thermally grown dielectrics. In addition metal-silicon plates, called silicides, are good electrical conductors, refractory in nature and have proven useful in fabricating capacitors. Polysilicon in combination with refractory metal silicides can form what is called a polycide which is also useful in forming capacitor plates.

While such capacitors can be fabricated to close tolerances, they commonly have an unacceptably high voltage coefficient of capacitance. This voltage coefficient varies the capacitance value with applied voltage. Where the capacitor value must be highly accurate, as in D/A and A/D converter applications, this voltage sensitivity can be a problem. In order to provide a 16-bit A/D conversion accuracy, the capacitor must not vary more than about ±15 ppm over a voltage range of ±20 volts. Using typical prior art construction, capacitor shifts of over 2500 ppm are common over the ±20 volt range. Clearly, such a shift makes the capacitor unsuitable for the converter applications involving more than about 10-bit accuracy.

U.S. Pat. No. 4,335,371 was issued to the assignee of the present invention on June 15, 1982. This patent shows the use of A/D converter circuits in which capacitor charge balancing is used in the comparator circuits. The teaching in this patent is incorporated herein by reference.

SUMMARY OF THE INVENTION

It is an object of the invention to provide a precision integrated circuit capacitor.

It is a further object of the invention to provide a precision integrated circuit capacitor that does not change capacitance significantly with applied voltage changes.

These and other objects are achieved in a capacitor which is provided with a plate protection layer during manufacture. This produces an oxide to plate interface that has a suitably low density of trapping states. As a result, the finished capacitor has a value of capacitance that does not vary significantly with applied voltage. Basically, a refractory metal or metal silicide base plate is established on the IC oxide surface. This plate is covered immediately with a layer of amorphous silicon which acts as a protective layer during IC fabrication. After the base plate has been etched to its final shape, the amorphous silicon layer is completely oxidized to form the dielectric layer. The top plate of the capacitor is formed by a metallized layer deposited on top of the oxide dielectric. The resulting capacitor can be fabricated to high tolerance and the applied voltage does not significantly change the capacitance.

BRIEF DESCRIPITION OF THE DRAWING

FIG. 1 is a cross-section of an IC substrate with an oxide thereon.

FIG. 2 is a cross-section of the substrate of FIG. 1 with a silicide and amorphous silicon layer deposited on the oxide.

FIG. 3 is a cross-section of a completed capacitor.

FIG. 4 is a graph showing the capacitance versus applied voltage characteristic of a capacitor made in accordance with the prior art.

FIG. 5 is a graph showing the capacitance versus applied voltage characteristic of a capacitor made in accordnce with the invention.

DESCRIPTION OF THE INVENTION

In the cross-section of FIG. 1 a silicon substrate 10 represents a monolithic silicon IC. The drawing represents a fragment of an IC wafer being processed in the conventional manner. The drawing is not to scale. The vertical dimension has been distorted for clarity. The oxide layer 11 represents the IC field isolation layer which normally covers the substrate. In FIG. 2 oxide layer 11 is overcoated with a capacitor electrode layer 12 of refractory metal silicide. The refractory metals contemplated include tantalum, titanium, molybdenum, miobium, tungsten, rhodium, platinum, osmium and iridium. This capacitor electrode layer is covered with a layer 13 of amorphous silicon. Layers 12 and 13 are deposited in situ. (This is the same deposition equipment used to deposit layer 12 is also used to deposit layer 13 without exposing the process wafer to atmosphere between depositions.) Typically layers 12 and 13 will be deposited in a conventional sputtering chamber. The silicide can be deposited using a dual target which consists of separate sources of the elements to be codeposited. For example, in the preferred process dual targets composed of pure tantalum and pure silicon can be used to codeposit tantalum and silicon that together form a layer of tantalum silicide. The sputtering conditions are adjusted so that the desired deposit composition is achieved. After the desired silicide thickness is achieved the tantalum deposition is halted and silicon deposition continued until the desired thickness of layer 13 is achieved. Alternatively, a tantalum silicide target can be sputtered and a second target composed of silicon can be used for the silicon deposition.

In another alternative embodiment layer 12 can be composed of a refractory metal alone. In this case the overlying amorphous silicon layer is desirably made relatively thin, on the order of 100 Å.

While sputtering is the preferred method for depositing layers 12 and 13 other methods can be employed. For example, low pressure chemical vapor deposition (LPCVD) can be employed. If desired, plasma enhanced chemical vapor deposition (PECVD) can be employed. The important element is to control the interface between layers 12 and 13. Desirably this interface will be continuously devoid of trapping sites and native oxides in the final capacitor.

The amorphous silicon layer 13 protects the surface of silicide layer (or refractory metal layer) 12 and isolates it from the processing ambients to which the IC wafer is subjected in subsequent processing. This permits the application of layers 12 and 13 at almost any point in the IC wafer fabrication sequence.

At a suitable point in the wafer fabrication process the capacitors are created. Here layers 12 and 13 are etched away as desired to leave the required capacitor plate. FIG. 3 shows a schematic representation of a finished capacitor Layers 12 and 13 are etched away so that the finished capacitor will have the desired area. Layer 13 is etched in addition so as to expose a region of layer 12 so that subsequent contact can be made to layer 12.

At this point amorphous silicon layer 13 is completely oxidized to create oxide layer 14. This is the capacitor dielectric. Since the surface of silicide layer (or refractory metal layer) 12 has been protected the interface between layers 12 and 14 will be continuous and free of trapping sites. It is noted that oxide layer 14 will be about 2.2 times thicker than layer 13 because the oxidation process produces a material that occupies a greater volume. However, since the upper surface of layer 13 is not constrained during oxidation, this does not create a problem. A metal layer 15 is deposited on top of oxide layer 14 to complete the capacitor structure. Terminals 16 and 17 illustrate schematically the connections that will be made to layers 12 and 15 in the finished IC. Actually, a portion of layer 12 is bared to subsequent IC metallization and layer 15 is composed directly of such metallization which is typically aluminum. The value of the finished capacitor will be determined by the area of the finished capacitor and the thickness of oxide layer 14. This latter factor is determined by the thickness of deposited layer 13. The area of the capacitor can be controlled fairly precisely by the photolithography used to make the IC. The thickness of layer 13 can be controlled fairly precisely by the deposition process and provides an in-process control of capacitance.

As pointed out above, layer 12 can be a refractory metal layer rather than a silicide. In this case a slightly different processing approach is used. First, as described above, when a metal layer 12 is employed the amorphous silicon layer is made very thin. An amorphous silicon layer thickness of about 100Å will produce a continuous coherent deposit that will act to protect the capacitor metal. Then, when the dielectric layer is to be formed, a silicon dioxide dielectric is deposited over the wafer to the desired thickness. The wafer is then annealed so that the thin amorphous silicon layer is diffused and absorbed into the upper surface of metal layer 12. This leaves a defect free and continuous interface between the deposited oxide and layer 12.

The important aspect of the invention is the fact that the finished capacitors have a very low voltage coefficient of capacitance. This means that the capacitance does not change with applied voltage.

It is well known that metal-oxide-semiconductor (MOS) capacitors display voltage sensitive capacitance. While this characteristic proves useful in some applications and is not deleterious in many other applications, there are instances where it is undesirable. One example is in A/D converters where capacitor charge balancing is employed in the comparator circuit functions. Here any capacitance variation can affect the device accuracy. Since a 16-bit A/D converter involves an LSB accuracy of $1.5 \times 10^{-3}\%$, a very small capacitance change can be significant. It has been determined that the capacitors in a 16-bit A/D converter should not vary more than ±15 ppm over a ±20-volt range.

FIG. 4 is a graph showing the value of a capacitor as a function of applied voltage. The capacitor was fabricated in accordance with prior art practice using a tantalum silicide layer with a deposited dielectric oxide thereon and an aluminum counter electrode. The graph shows the typical MOS capacitor characteristic. The capacitance variations for the negative applied voltage are on the order of about 70–86 ppm which is excessive for a 16-bit converter. The overall range of the graph capacitance is over 2660 ppm.

FIG. 5 is a graph of the capacitance versus voltage for a similar size capacitor made in accordance with the invention. It will be noted that overall change in capacitance is less than ±6 ppm. If the graph of FIG. 5 were to be superimposed on that of FIG. 4 the vertical coordinates would convert the FIG. 5 showing to a substantially straight line.

The mechanism by which the invention operates is not fully understood, but the processing requirements outlined above function well. It has been speculated that the essential element be a clean capacitor metal to dielectric interface free of native oxide and continuous. The dielectric should not include any trapping centers that can act to modulate the current flow in the capacitor metal. It is well known that trapping centers in a MOS capacitor significantly vary the capacitance. Apparently the trapping centers can accumulate a charge that will attract or repel charges in the underlying conductor and thereby create or modulate a depletion region at the metal surface. If the depletion region is enlarged the capacitor dielectric is in effect thickened and the capacitance reduced. For a reduced depletion region thickness the capacitance is increased. The main factor is that such a depletion region will be varied with applied voltage thereby making the capacitance voltage sensitive.

EXAMPLE

Test capacitors were fabricated on a silicon wafer that had a uniform grown oxide of about 6000Å on its surface. Tantalum silicide was sputtered from individual tantalum and silicon targets in a Perkin Elmer Model 4450 Sputter system. The sputtering conditions were adjusted so that the silicide had a silicon-to-tantalum ratio of 2.4 to 1. A 1000Å layer was deposited. Then the tantalum target was turned off and an amorphous silicon layer about 700521 thick was deposited. The silicide and amorphous silicon layers were then photolithographically patterned and etched to form a series of test capacitors. The capacitors were etched so that portions of the silicide layer were exposed for contact purposes. The wafer was then heated in an oxidizing atmosphere for a sufficient time to completely oxidize the exposed amorphous silicon. Then a one micron aluminum layer was deposited lover the wafer and photolithographically patterned and etched to form the capacitor counter electrodes. The capacitors were then packaged to isolate them from the ambient and the package connected to a test circuit. The capacitance versus voltage characteristics was then measured. The data for the FIG. 5 graph was thus obtained. The test circuit involved connecting the capacitors into an oscillator circuit operating at low signal level. The oscillator frequency was measured as a function of the d-c voltage applied to the capacitor. The frequency changes were translated to a change in capacitance which could be related in ppm to the nominal capacitor zero voltage value. It is to be noted that while the values of FIG. 4 look large the actual percentage change is small. The worst case part of the graph is on the order of ¼%.

The invention has been described and a working example detailed. When a person skilled in the art reads the foregoing description, alternatives and equivalents, within the spirit and intent of the invention will be apparent. Accordingly, it is intended that the scope of the invention be limited only by the following claims.

I claim:

1. A capacitor suitable for fabrication on a monolithic silicon integrated circuit, said capacitor having a very low voltage coefficient of capacitance and comprising:

a first plate composed of a material selected from the group consisting of refractory metals and refractory metal silicides;

a dielectric layer located on said first plate, said dielectric layer being characterized as having a very low incidence of interface trapping states where it contacts the first plate;

a second plate located on top of said dielectric layer; and means for making electrical connnections to said first and second plates.

2. The capacitor of claim 1 wherein said second plate comprises the metallization of said integrated circuit.

3. In the process for fabricating a capacitor on a monolithic silicon integrated circuit, the steps:

depositing a first conduction layer on said integrated circuit, said first conduction layer being composed of a material selected from the group consisting of refractory metals and refractory metal silicides;

depositing a protective layer on said first conduction layer;

forming a dielectric layer on said first conduction layer; and forming a conductive counter electrode on said dielectric layer.

4. The process of claim 3 wherein said protective layer is composed of amorphous silicon.

5. The process of claim 4 wherein said dielectric layer is formed by oxidizing said amorphous silicon layer.

6. The process of claim 4 wherein said first layer is a refractory metal and said amorphous silicon layer is made very thin, with respect to said first layer, and including the additional steps of depositing said dielectric layer on said protective layer and annealing the composite layers to cause said protective layer to be absorbed into said first layer as a silicide.

* * * * *